United States Patent
Sohn et al.

(10) Patent No.: US 7,269,085 B2
(45) Date of Patent: Sep. 11, 2007

(54) NON VOLATILE SEMICONDUCTOR MEMORY DEVICE HAVING A MULTI-BIT CELL ARRAY

(75) Inventors: Han-Gu Sohn, Suwon-si (KR); Sei-Jin Kim, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 82 days.

(21) Appl. No.: 11/317,429

(22) Filed: Dec. 23, 2005

(65) Prior Publication Data

US 2006/0146630 A1    Jul. 6, 2006

(30) Foreign Application Priority Data

Jan. 5, 2005    (KR) ...................... 10-2005-0000689

(51) Int. Cl.
*G11C 7/00*    (2006.01)

(52) U.S. Cl. ...................................... 365/222; 365/201

(58) Field of Classification Search ................ 365/222, 365/201, 200
See application file for complete search history.

(56) References Cited

U.S. PATENT DOCUMENTS

| | | | |
|---|---|---|---|
| 5,644,545 A | | 7/1997 | Fisch |
| 6,167,544 A | * | 12/2000 | Brady ........................ 714/721 |
| 2003/0147295 A1 | * | 8/2003 | Frankowsky et al. ....... 365/222 |

* cited by examiner

*Primary Examiner*—Vu A. Le
(74) *Attorney, Agent, or Firm*—F. Chau & Associates, LLC

(57) ABSTRACT

A semiconductor device is provided. The semiconductor device includes a storage part storing an address for weak cells in a nonvolatile state; and a dynamic semiconductor memory device including: a memory cell array having normal cells and the weak cells to be refreshed; and a refresh control part performing a refresh operation for the weak cells, wherein a refresh period for the weak cells is shorter than a refresh period for the normal cells when the address applied in a refresh operation mode coincides with the address stored in the storage part.

21 Claims, 5 Drawing Sheets

NON VOLATILE SEMICONDUCTOR MEMORY DEVICE HAVING A MULTI-BIT CELL ARRAY

CROSS-REFERENCE TO RELATED APPLICATION

This application claims priority to Korean Patent Application No. 10-2005-0000689, filed Jan. 5, 2005, the disclosure of which is incorporated by reference herein in its entirety.

BACKGROUND OF THE INVENTION

1. Technical Field

The present invention relates to a semiconductor device, and more particularly, to a semiconductor memory device that provides varying refresh periods to its memory cells in accordance with a data retention capability of the memory cells.

2. Discussion of Related Art

A semiconductor device typically includes a semiconductor memory device such as a DRAM for storing data. In a DRAM memory cell, data is stored as electrons in a capacitor. However, data may be lost due to a leakage current of the capacitor. To prevent the loss of data due to a leakage current, a refresh operation is performed in the DRAM memory cell.

FIG. 1 illustrates a refresh operation in a DRAM memory cell of a conventional semiconductor device. Referring to FIG. 1, a refresh command is initiated (2) and input to a refresh counter of the semiconductor device. The refresh counter then determines a row address to be refreshed (4), the address generator generates the address to be refreshed (6) and the memory cell associated with the address is refreshed (8).

In more detail, the refresh operation is performed by turning on a word line of a DRAM memory cell array, which corresponds to a row address, with a high row address strobe (RAS), and activating a bit line sense amplifier connected to the row address. This operation is known as an RAS refresh operation. At this time, all the cells connected to the word line are refreshed concurrently by reading out stored data and rewriting the stored data before the stored data is lost. The refresh operation is then repeated until all the rows of the DRAM memory cell array are selected so that the entire DRAM can be refreshed.

Since data retention time is not the same in all the cells, a refresh time is determined based on the cell having the shortest retention time. Thus, the refresh operation is performed before the cell having the shortest retention time loses data. In other words, the refresh operation is performed before electrons stored in the capacitor of the memory cell having the shortest retention time are discharged. Otherwise, a refresh period may not be uniform since it becomes difficult to identify between data values of '1' and '0' in the memory cell.

Since many mobile electronic products such as cellular phones are battery dependent and employ dynamic memories for storing data, low power consumption, particularly that resulting from the reduction of a stand-by current used for self-refresh in a DRAM, is becoming an increasingly important design constraint. Accordingly, there is a need for reducing the power consumption of a dynamic memory employed by a mobile electronic product.

SUMMARY OF THE INVENTION

A preferred embodiment of the present invention provides a semiconductor device including a storage part storing an address for weak cells in a non-volatile state; and a dynamic semiconductor memory device comprising: a memory cell array having normal cells and the weak cells to be refreshed; and a refresh control part performing a refresh operation for the weak cells, wherein a refresh period for the weak cells is shorter than a refresh period for the normal cells when an address applied in a refresh operation mode coincides with the address stored in the storage part.

The refresh control part may include an initial setting part receiving the address stored in the storage part, and storing the address.

The refresh control part may also include an address comparator receiving the address stored in the initial setting part and the address applied in the refresh operation mode, and determining if the address stored in the initial setting part coincides with the address applied in the refresh operation mode.

The refresh control part may further include a refresh determining part refreshing memory cells addressed by the address applied in the refresh operation mode when the address stored in the initial setting part coincides with the address applied in the refresh operation mode; selecting and refreshing memory cells addressed by the address applied in the refresh operation mode in a first state in which a refresh control counter value is increased when the address stored in the initial setting part does not coincide with the address applied in the refresh operation mode; and not refreshing memory cells addressed by the address applied in the refresh operation mode in a second state in which the refresh control counter value is not increased.

The refresh control counter may be converted from the second state to the first state when the memory cells addressed by the address applied in the refresh operation mode are not refreshed in the refresh determining part, and may be converted from the first state to the second state when the memory cells addressed by the address applied in the refresh operation mode are refreshed in the refresh determining part.

The address for the weak cells and the address applied in the refresh operation mode may be row addresses addressing a row of cells of the memory cell array.

The weak memory cells and the normal memory cells may be classified in accordance with a test. Memory cells that have a tested data retention capability below a reference time are classified as the weak cells, and memory cells that have a tested data retention capability above the reference time are classified as the normal cells.

The storage part is a first chip and the dynamic semiconductor memory device is a second chip. The address of the weak cells stored in the first chip is sent to a microcontroller and the address of the weak cells is loaded to the second chip by the microcontroller.

Another preferred embodiment of the present invention provides a semiconductor device including a storage part storing an address for normal cells; and a dynamic semiconductor memory device comprising: a memory cell array having the normal cells and weak cells to be refreshed; and a refresh control part performing a refresh operation for the normal cells, wherein a refresh period for the normal cells is longer than a refresh period for the weak cells when the address applied in a refresh operation mode coincides with the address stored in the storage part.

Another preferred embodiment of the present invention provides a semiconductor device having memory cells to be refreshed in a predetermined pause time. The semiconductor device includes a first mode storing one of an address addressing weak cells having a first pause time within the predetermined pause time and an address addressing normal cells having a second pause time that is longer that the predetermined pause time to a storage part connected to a dynamic semiconductor memory device having the weak and normal memory cells, and performing a first refresh operation by varying a refresh period for the weak cells and the normal cells using the address stored in the storage part; and a second mode performing a second refresh operation for the weak cells and the normal cells by using a same refresh period.

The semiconductor device may further include a mode selecting part storing information identifying the first mode and the second mode, and selecting the first mode or the second mode in accordance with the stored information.

BRIEF DESCRIPTION OF THE DRAWINGS

The above and other features of the present invention will become more apparent to those of ordinary skill in the art by describing in detail preferred embodiments thereof with reference to the attached drawings in which.

DETAILED DESCRIPTION OF PREFERRED EMBODIMENTS

Figure 1:
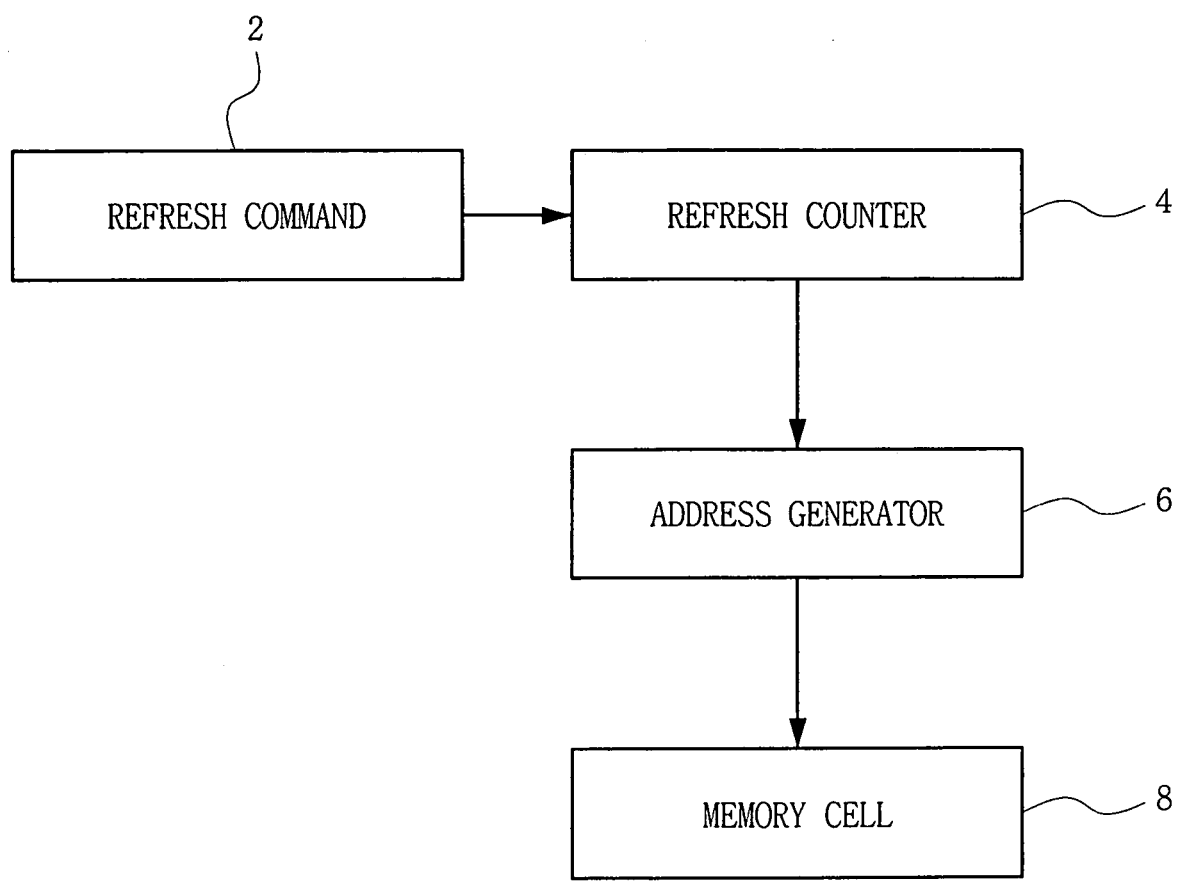
FIG. 1 is a block diagram illustrating a refresh operation in a memory cell of a conventional semiconductor device.

The present invention will now be described with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements.

Figure 2:
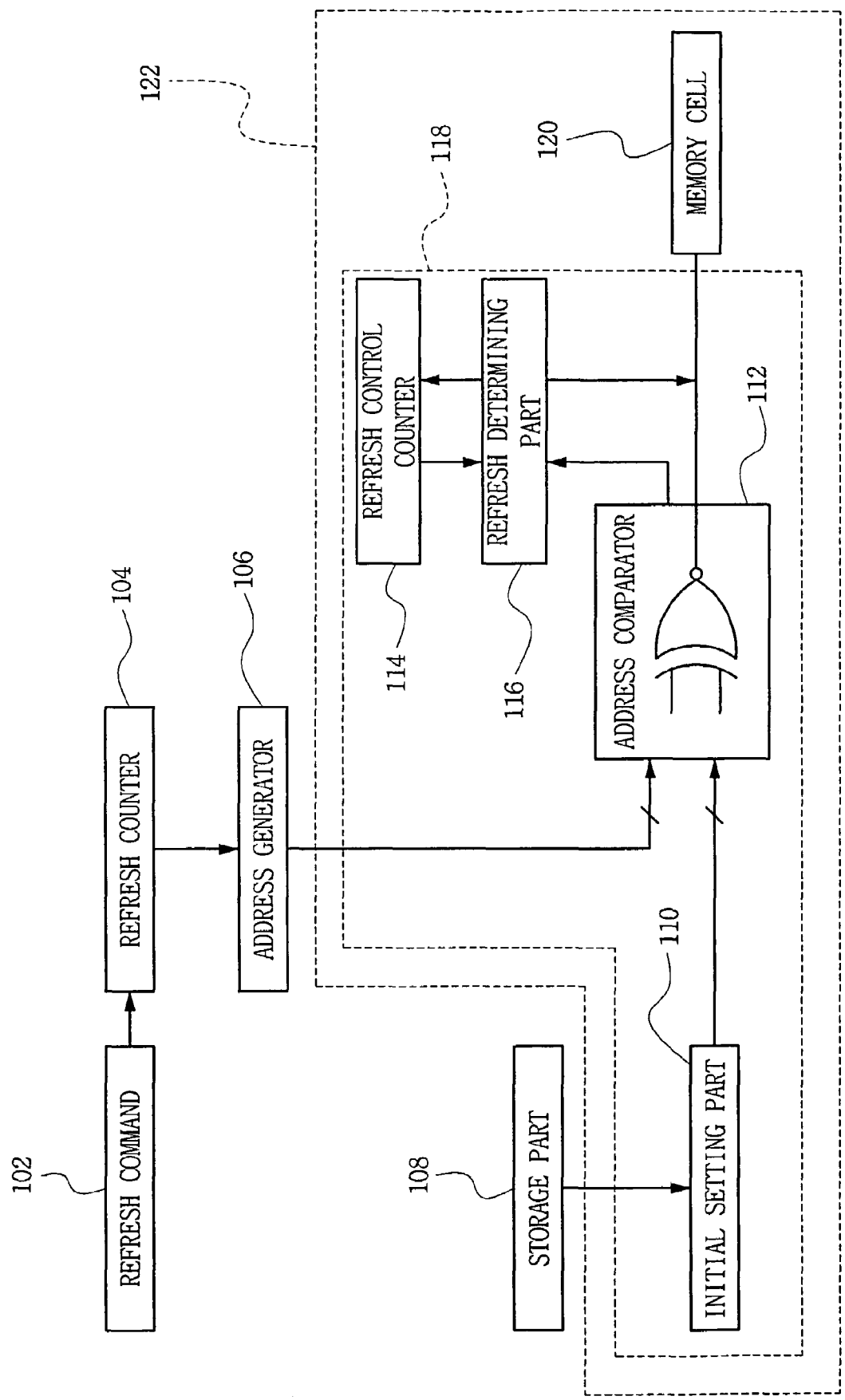
FIG. 2 is a block diagram illustrating a structure of a semiconductor device according to a first preferred embodiment of the present invention.

FIG. 2 is a block diagram illustrating the structure of a semiconductor device according to a first preferred embodiment of the present invention.

Referring to FIG. 2, the semiconductor device includes a storage part 108, which exists as a first chip, and stores addresses for weak memory cells, classified in accordance with a test, in a non-volatile state. The semiconductor device further includes a second chip 122 including a memory cell array 120 having normal memory cells requiring a refresh operation and the weak cells. The second chip 122 is a dynamic semiconductor memory device requiring a refresh operation.

The second chip 122 includes a refresh variable control part 118 for performing a refresh operation for the weak cells, wherein a refresh period of the weak cells is shorter than a refresh period of the normal cells, when the address applied in a refresh operation mode coincides with the address stored in the storage part 108. In other words, the refresh operation is performed faster in the weak cells than in the normal cells.

The refresh variable control part 118 includes an initial setting part 110, an address comparator 112, a refresh control counter 114, and a refresh determining part 116.

The initial setting part 110 receives the address stored in the storage part 108, which is for example, an address of one of the weak cells, and stores the address.

The address comparator 112 receives the address stored in the initial setting part 110 and the address applied in the refresh operation mode, and determines if the address stored in the initial setting part 110 coincides with the address applied in the refresh operation mode.

If the address stored in the initial setting part 110 coincides with the address applied in the refresh operation mode, the refresh determining part 116 refreshes the memory cells addressed by the address applied in the refresh operation mode. On the contrary, when the address stored in the initial setting part 110 does not coincide with the address applied in the refresh operation mode, the memory cells addressed by the address applied in the refresh operation mode are refreshed in accordance with a state of the refresh control counter 114.

For example, the memory cells addressed by the address applied in the refresh operation mode are refreshed in a first state in which a value of the refresh control counter 114 is increased. However, when in a second state in which a value of the refresh control counter 114 is not increased, the memory cells addressed by the address applied in the refresh operation mode are not refreshed.

When the memory cells addressed by the address applied in the refresh operation mode are not refreshed in the refresh determining part 116, the refresh control counter 114 converts the second sate into the first state. For example, if the refresh control counter 114 is in a second state, '0', the second state is converted into a first state, '1'. On the contrary, when the refresh control counter 114 is in a first state, '1', since one refresh has been skipped, the memory cells addressed by the address applied in the refresh operation mode are refreshed, and the refresh control counter 114 is converted into a second state, '0'.

To determine if a memory cell is weak or normal, an autorefresh test is performed on each of the memory cells in the second chip 122. For example, if the cells have a tested data retention capability below a predetermined reference time, they are classified as weak cells, and if the cells have a tested data retention capability above the predetermined reference time, they are classified as normal cells.

The address for the weak cells and the address applied in the refresh operation mode are preferably column addresses addressing columns of the cells. Thus, all the cells connected to the word line selected by the column address are refreshed concurrently when performing a refresh operation.

In addition, the number of cycles required until all the rows of the dynamic semiconductor memory device are selected and refreshed is called a refresh cycle. Further, the refresh period divided by the refresh cycle is called a refresh interval. In other words, the refresh interval is an interval for each refresh cycle when the refresh is performed.

Figure 3:
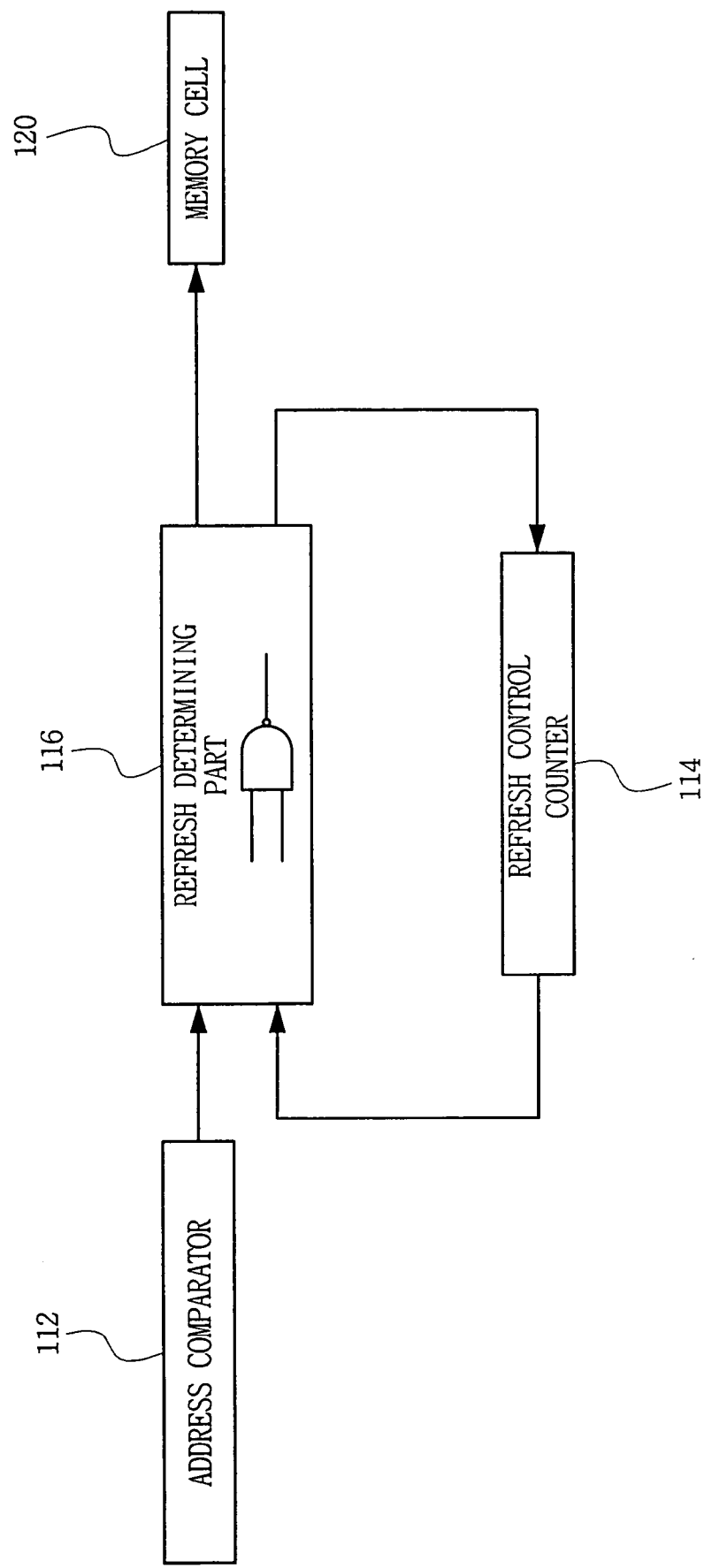
FIG. 3 is a block diagram illustrating an operation of a refresh determining part and a refresh control counter of FIG. 2.

FIG. 3 is a block diagram illustrating an operation of the refresh determining part 116 and the refresh control counter 114 of FIG. 2.

Referring to FIG. 3, when a value of the refresh control counter 114 is in a second state, '0', the refresh determining part 116 receives and NANDs the address output from the address comparator 112 and the value of the refresh control counter 114. Since a result of the operation in the refresh determining part 116 is always '1', the memory cells 120 are not refreshed, and a value of the refresh control counter 114 is converted into a first state, '1'. Then, when the same addresses are input into the refresh determining part 116, since a value of the refresh control counter 114 is maintained in the first state, the value refresh control counter 114 is converted into the second state.

Hereinafter, a second preferred embodiment of the present invention will be explained with reference to FIGS. 2 and 3.

As shown in FIGS. 2 and 3, a semiconductor device according to the second preferred embodiment includes a storage part 108, which exists as a first chip, and stores addresses for normal cells in a nonvolatile state. The storage part 108 does not store address for weak cells. The semiconductor device further includes a second chip 122 including a memory cell array 120 having normal cells requiring a refresh operation and the weak cells. The second chip 122 is a dynamic semiconductor memory device requiring a refresh operation.

The second chip 122 includes a refresh variable control part 118 for performing a refresh operation for the normal cells, wherein a refresh period of the normal cells is longer than a refresh period for the weak cells, when the address applied in a refresh operation mode coincides with the address stored in the storage part. In other words, the refresh operation is performed slower in the normal cells than in the weak cells.

The refresh variable controller 118 includes an initial setting part 110, an address comparator 112, a refresh control counter 114, and a refresh determining part 116.

The initial setting part 110 receives the address stored in the storage part 108 and stores the address. The address comparator 112 receives the address stored in the initial setting part 110 and the address applied in the refresh operation mode, and determines if the address stored in the initial setting part 110 coincides with the address applied in the refresh operation mode.

The refresh determining part 116 performs a refresh operation for the memory cells addressed by the address applied in the refresh operation mode when the address stored in the initial setting part 110 does not coincide with the address applied in the refresh operation mode.

The refresh determining part 116 also performs a refresh operation for the memory cells addressed by the address applied in the refresh operation mode in a first state when a value of the refresh control counter 114 is increased when the address stored in the initial setting part coincides with the address applied in the refresh operation mode, and does not perform a refresh operation for the memory cells addressed by the address applied in the refresh operation mode in a second state when a value of the refresh control counter 114 is not increased.

Figure 4:
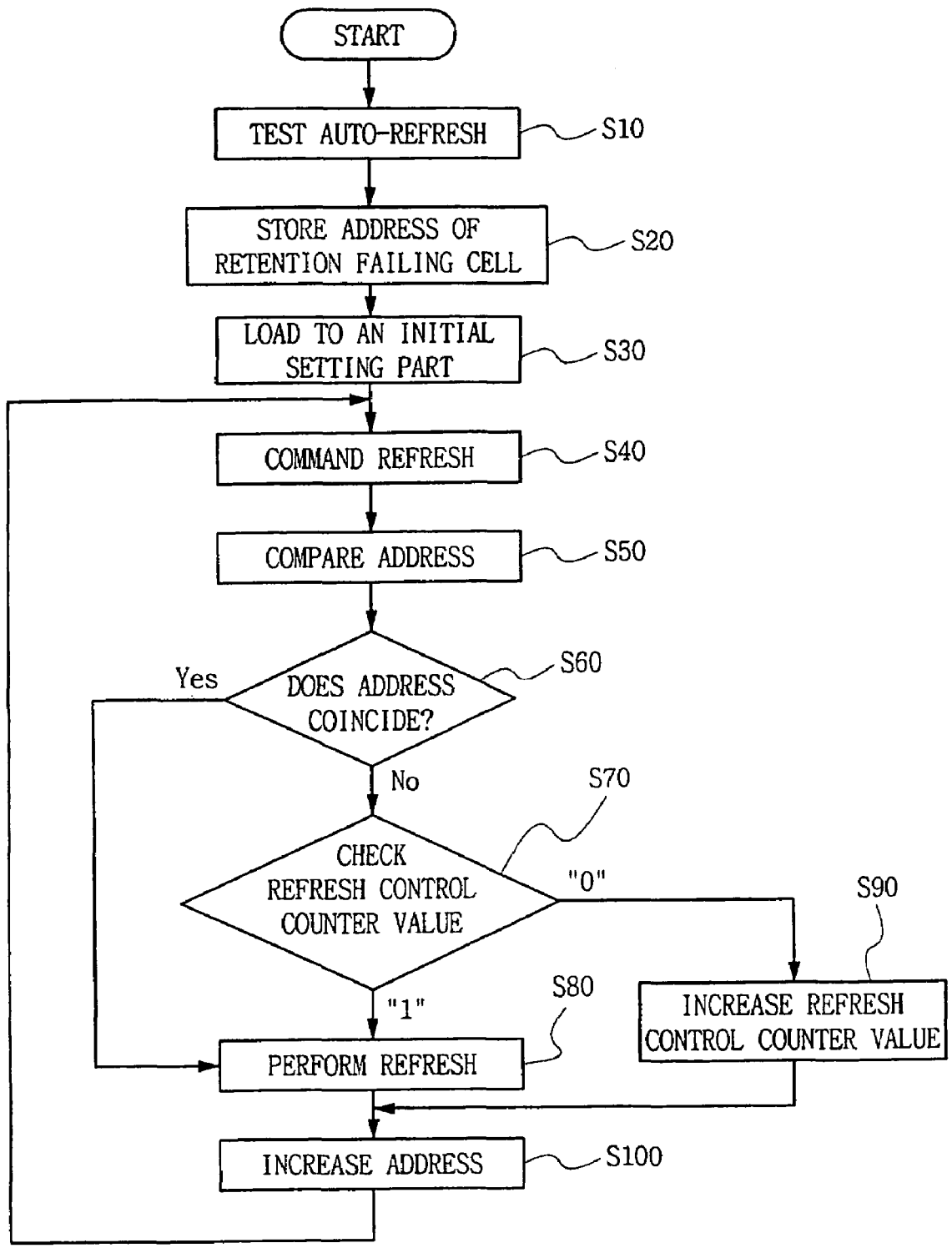
FIG. 4 is a flowchart illustrating a refresh operation performed in the semiconductor device of FIG. 2.

FIG. 4 is a flowchart illustrating a refresh operation performed in the semiconductor device of FIG. 2.

Referring to FIG. 4, an autorefresh test for the memory cells 120 of the second chip 122 is performed (S10). Once the autorefresh test has been performed, the addresses of the weak cells are stored in the storage part 108 (S20), and loaded to the initial setting part 110 (S30).

If a refresh command is applied (S40), the address applied in a refresh operation mode and the address stored in the storage part 108 are compared in the address comparator 112 (S50). If both addresses coincide (S60), a refresh is performed (S80), and if not, a value of the refresh control counter 114 is checked (S70). If the value is, '1', the refresh is performed (S80) and if the value is, '0', the value is increased (S90). Then, the address is increased (S100), and the operations are repeated for all the memory cells 120.

In this manner, the weak cells are sensed, and the rows including the weak memory cells can be controlled so that the current consumed by the refresh can be reduced. In addition, since a refresh is performed on the weak cells faster than that of a refresh performed on the normal cells, the refresh current consumed in the normal cells can be reduced.

Hereinafter, a third preferred embodiment of the present invention will be described.

In the third preferred embodiment, a semiconductor device, for example, a semiconductor device similar to that shown in FIG. 2, requiring a refresh operation for its memory cells 120 within a predetermined pause time is provided. The predetermined pause time is determined in accordance with a data retention capability of the memory cells 120.

The semiconductor device according to the third preferred embodiment stores either one of an address addressing the weak cells having a first pause time that is shorter than the predetermined pause time, and an address addressing the normal cells having a second pause time that is longer than the predetermined pause time to the storage part 108 connected to the dynamic semiconductor memory device including 122 the memory cells 120 so that the refresh is performed independently in a first mode and a second mode.

For example, in the first mode, a refresh is performed using the address stored in the storage part 108 by using different refresh periods for the weak cells and the normal cells respectively. The refresh period for the weak cells is shorter than the refresh period for the normal cells. In the second mode, however, a refresh is performed by using the same refresh period for the weak cells and the normal cells.

Still referring to the third preferred embodiment, the semiconductor device stores information identifying the first mode and the second mode, and includes a mode selecting part for selecting the first mode or the second mode by using the stored information. The mode selecting part may use a mode register set including a mode register for setting and storing the operation mode of the semiconductor device.

The mode register set may include a series of codes for showing the modes of the semiconductor memory device. These codes are called a mode register set code. In the mode register set code, a code combination which was not already used may be used to identify the first mode and the second mode to perform the refresh as described above.

Figure 5:
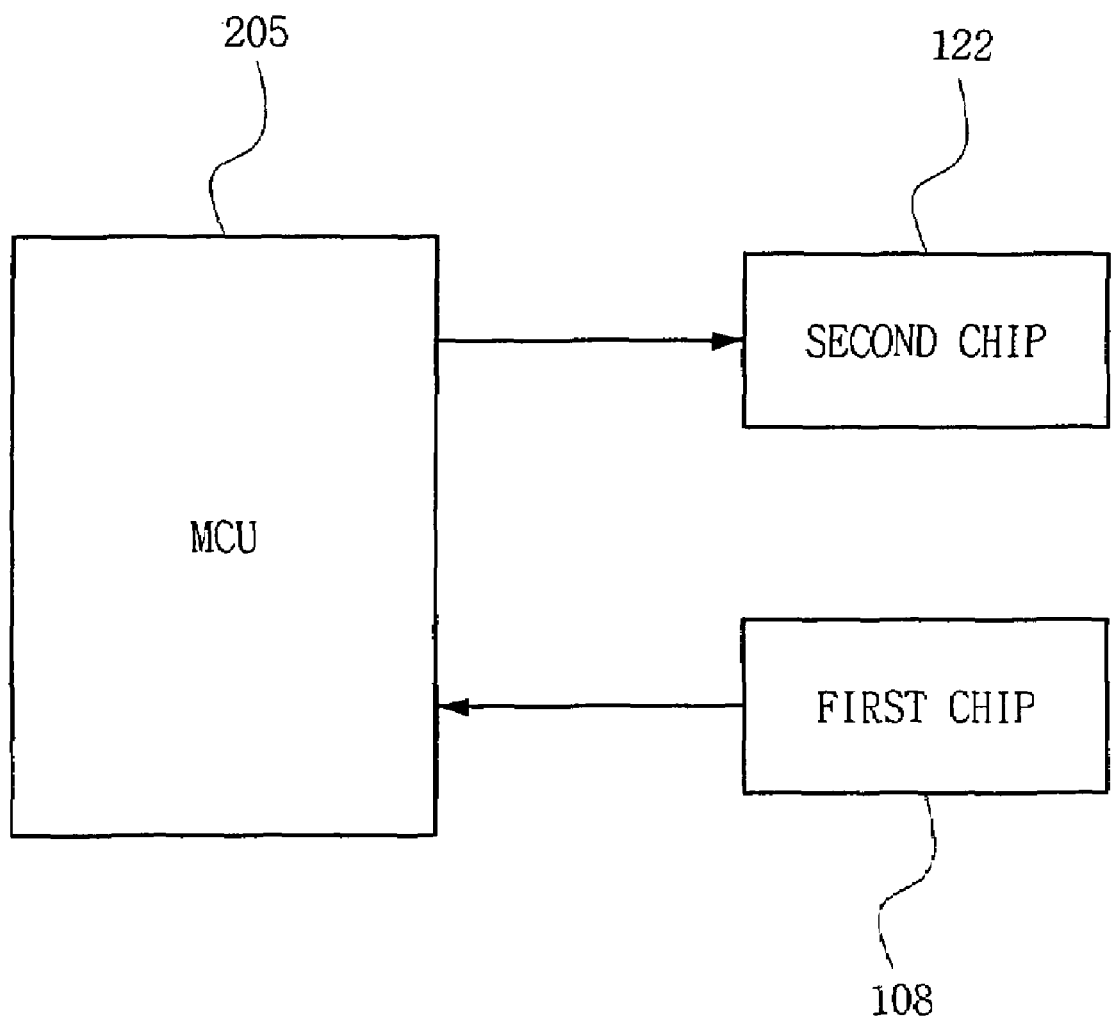
FIG. 5 is a block diagram illustrating a relationship between a first chip, a second chip, and a microcontroller in the semiconductor device of FIG. 2.

FIG. 5 is a block diagram illustrating a relationship between a first chip, a second chip, and a microcontroller (MCU) in the semiconductor device of FIG. 2.

Referring to FIG. 5, the address of the weak cells is stored in the first chip 108 and sent to the microcontroller 205, and is loaded to the initial setting part 110 of the second chip 122 by the microcontroller 205 and stored.

According to a preferred embodiment of the present invention, a semiconductor device is provided which stores addresses for addressing normal cells and weak cells classified in accordance with a data retention test on a first chip and performs a refresh operation with different periods for the normal cells and weak cells on a second chip. Thus, reducing the current consumed during refresh of all the memory cells and a stand-by current used for self refresh by a dynamic semiconductor memory device.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A semiconductor device, comprising:
a storage part storing an address for weak cells in a non-volatile state; and
a dynamic semiconductor memory device comprising:
a memory cell array having normal cells and the weak cells to be refreshed; and
a refresh control part performing a refresh operation for the weak cells, wherein a refresh period for the weak cells is shorter than a refresh period for the normal cells when an address applied in a refresh operation mode coincides with the address stored in the storage part.

2. The semiconductor device according to claim 1, wherein the refresh control part comprises an initial setting part receiving the address stored in the storage part, and storing the address.

3. The semiconductor device according to claim 2, wherein the refresh control part comprises an address comparator receiving the address stored in the initial setting part and the address applied in the refresh operation mode, and determining if the address stored in the initial setting part coincides with the address applied in the refresh operation mode.

4. The semiconductor device according to claim 3, wherein the refresh control part comprises a refresh determining part refreshing memory cells addressed by the address applied in the refresh operation mode when the address stored in the initial setting part coincides with the address applied in the refresh operation mode; selecting and refreshing the memory cells addressed by the address applied in the refresh operation mode in a first state in which a refresh control counter value is increased when the address stored in the initial setting part does not coincide with the address applied in the refresh operation mode; and not refreshing the memory cells addressed by the address applied in the refresh operation mode in a second state in which the refresh control counter value is not increased.

5. The semiconductor device according to claim 4, wherein the refresh control counter is converted from the second state to the first state when the memory cells addressed by the address applied in the refresh operation mode are not refreshed in the refresh determining part, and is converted from the first state to the second state when the memory cells addressed by the address applied in the refresh operation mode are refreshed in the refresh determining part.

6. The semiconductor device according to claim 5, wherein the address for the weak cells and the address applied in the refresh operation mode are row addresses addressing a row of cells in the memory cell array.

7. The semiconductor device according to claim 1, wherein the weak memory cells and the normal memory cells are classified in accordance with a test.

8. The semiconductor device according to claim 7, wherein memory cells that have a tested data retention capability below a reference time are classified as the weak cells, and memory cells that have a tested data retention capability above the reference time are classified as the normal cells.

9. The semiconductor device according to claim 1, wherein the storage part is a first chip and the dynamic semiconductor memory device is a second chip.

10. The semiconductor device according to claim 9, wherein the address of the weak cells stored in the first chip is sent to a microcontroller and the address of the weak cells is loaded to the second chip by the microcontroller.

11. A semiconductor device, comprising:
a storage part storing an address for normal cells; and
a dynamic semiconductor memory device comprising:
a memory cell array having the normal cells and weak cells to be refreshed; and
a refresh control part performing a refresh operation for the normal cells, wherein a refresh period for the normal cell is longer than a refresh period for the weak cells when the address applied in a refresh operation mode coincides with the address stored in the storage part.

12. The semiconductor device according to claim 11, wherein the refresh control part comprises an initial setting part receiving the address stored in the storage part, and storing the address.

13. The semiconductor device according to claim 12, wherein the refresh control part comprises an address comparator receiving the address stored in the initial setting part and the address applied in the refresh operation mode, and determining if the address stored in the initial setting part coincides with the address applied in the refresh operation mode.

14. The semiconductor device according to claim 13, wherein the refresh control part comprises a refresh determining part refreshing memory cells addressed by the address applied in the refresh operation mode when the address stored in the initial setting part does not coincide with the address applied in the refresh operation mode; refreshing the memory cells addressed by the address applied in the refresh operation mode in a first state in which a refresh control counter value is increased when the address stored in the initial setting part coincides with the address applied in the refresh operation mode; and not refreshing the memory cells addressed by the address applied in the refresh operation mode in a second state in which the refresh control counter value is not increased.

15. The semiconductor device according to claim 14, wherein the refresh control counter is converted from a second state to a first state when the memory cells addressed by the address applied in the refresh operation mode are not refreshed in the refresh determining part, and is converted from the first state to the second state when the memory cells addressed by the address applied in the refresh operation mode are refreshed in the refresh determining part.

16. The semiconductor device according to claim 15, wherein the address for the weak cells and the address applied in the refresh operation mode are row addresses addressing a row of cells in the memory cell array.

17. The semiconductor device according to claim 11, wherein the weak memory cells and the normal memory cells are classified in accordance with a test.

18. The semiconductor device according to claim 17, wherein memory cells that have a tested data retention capability below a reference time are classified as the weak cells, and memory cells that have a tested data retention capability above the reference time are classified as the normal cells.

19. The semiconductor device according to claim 11, wherein the storage part is a first chip and the dynamic semiconductor memory device is a second chip.

20. The semiconductor device according to claim 19, wherein the address of the weak cells stored in the first chip is sent to a microcontroller and the address of the weak cells is loaded to the second chip by the microcontroller.

21. A semiconductor device comprising memory cells to be refreshed in a predetermined pause time, the semiconductor device comprising:

a first mode storing one of an address addressing weak cells having a first pause time within the predetermined pause time and an address addressing normal cells having a second pause time that is longer than the predetermined pause time to a storage part connected to a dynamic semiconductor memory device having the weak and normal memory cells, and performing a first refresh operation by varying a refresh period for the weak cells and the normal cells using the address stored in the storage part; and a second mode performing a second refresh operation for the weak cells and the normal cells by using a same refresh period.

* * * * *